(12) United States Patent
Coolbaugh et al.

(10) Patent No.: US 7,183,628 B2
(45) Date of Patent: Feb. 27, 2007

(54) STRUCTURE AND METHOD OF HYPER-ABRUPT JUNCTION VARACTORS

(75) Inventors: Douglas D. Coolbaugh, Essex Junction, VT (US); Stephen S. Furkay, South Burlington, VT (US); Jeffrey B. Johnson, Essex Junction, VT (US); Robert M. Rassel, Colchester, VT (US); David C. Sheridan, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 11/004,877

(22) Filed: Dec. 7, 2004

(65) Prior Publication Data
US 2005/0161770 A1    Jul. 28, 2005

Related U.S. Application Data

(62) Division of application No. 10/707,905, filed on Jan. 23, 2004.

(51) Int. Cl.
*H01L 29/93* (2006.01)
(52) U.S. Cl. .................. 257/595; 257/600
(58) Field of Classification Search ............ 257/595, 257/600, 607
See application file for complete search history.

(56) References Cited

U.S. PATENT DOCUMENTS

| | | | |
|---|---|---|---|
| 3,636,420 A * | 1/1972 | Vendelin et al. ........... 257/602 |
| 3,638,300 A | 2/1972 | Foxhall et al. |
| 4,590,439 A | 5/1986 | Goggin |
| 4,642,580 A | 2/1987 | Scott |
| 4,668,306 A | 5/1987 | Nishizawa |
| 4,814,284 A * | 3/1989 | Inoue et al. ............... 438/379 |
| 6,014,064 A | 1/2000 | Boles et al. |
| 6,521,506 B1 | 2/2003 | Coolbaugh et al. |
| 6,521,939 B1 | 2/2003 | Yeo et al. |
| 6,559,024 B1 | 5/2003 | Boles et al. |
| 6,995,068 B1 * | 2/2006 | Racanelli et al. .......... 438/379 |

FOREIGN PATENT DOCUMENTS

| | | |
|---|---|---|
| JP | 63-300570 | 12/1988 |
| JP | 64-19779 | 1/1989 |

* cited by examiner

*Primary Examiner*—Mark V. Prenty
(74) *Attorney, Agent, or Firm*—Anthony J. Canale; Greenblum & Bernstein, P.L.C.

(57) ABSTRACT

A method and device providing a HA junction varactor which may be fabricated with a reduced variation in C-V tuning curve from one varactor to the next. The process produces a varactor with an active region formed substantially by doping an Si substrate with various dopants at various energy levels. Accordingly, unit-to-unit device variation is reduced because etching, growing, and deposition processes to make the active portion of the varactor are reduced or eliminated. The resulting HA junction has a more uniform thickness, and a more uniform doping profile.

13 Claims, 3 Drawing Sheets

STRUCTURE AND METHOD OF HYPER-ABRUPT JUNCTION VARACTORS

CROSS REFERENCE TO RELATED APPLICATIONS

This application is a divisional application of U.S. application Ser. No. 10/707,905, filed on Jan. 23, 2004, which is now incorporated herein by reference in its entirety.

BACKGROUND OF INVENTION

1. Field of the Invention

The invention generally relates to varactors and, more particularly relates to hyper-abrupt (HA) junction varactors and a method of fabrication of HA junction varactors in CMOS, rf-CMOS, BiCMOS or analog technologies.

2. Background Description

Varactors form a class of tunable semiconductor capacitors typically derived from pn-junctions, where the pn-junction is operated in a reverse bias state. The capacitance of the varactor may be varied by adjusting the reverse bias voltage, and thus varactors are characterized by a C-V tuning curve. Varactors are especially useful in oscillator circuits, especially voltage-controlled oscillators, where the varactor tunability is used to tune the oscillation frequency of the circuit. Thus, varactors find use in cellular phones, televisions and radios, computers, active filters, and wherever a first signal is synchronized to second signal.

Varactor functioning is most easily understood in the terms of a basic capacitor. In general, a capacitor consists of two conductive plates separated by a dielectric. Opposite charges collect on the capacitor plates when a voltage potential is applied across the plates. The capacitance of the capacitor, and its ability to hold a certain amount of charge at a certain voltage, depends on the distance between the two plates, among other parameters. The larger the distance between the two plates, the less the capacitance and the less charge the capacitor can hold at a given voltage potential.

A pn-junction may function as a capacitor in the reverse bias mode because the reversed voltage potential causes charge carriers to move away from the pn-junction. The facing edges of the p and n regions collect the charge and act as the conductive plates, i.e. the anode and cathode. As the charge carriers move away from the pn-junction, a depletion region near the junction is formed which is the equivalent of a dielectric in a standard capacitor. As the voltage potential is increased, the charge carriers move farther away from the pn-junction, which is equivalent to increasing the distance between the two conductive plates of a standard capacitor. Accordingly, the capacitance of a varactor is, in part, voltage dependent and may be tuned over a particular range. The capacitance of a varactor is also dependent on other parameters such as junction area and the doping densities in the junction.

The doped region of a varactor is typically formed in semiconductor film deposited on the varactor cathode. Different doping profiles within the film may be used to achieve different capacitance-voltage tuning relationships (C-V tuning curves). The first varactors were constrained to linear doping profiles because of fabrication limitations. Such varactors have a C-V tuning curve where capacitance is proportional to the inverse cube root of the tuning voltage. As fabrication methods improved, it became possible to closely control doping profiles, and varactors with uniform doping profiles became available. The uniform doped varactors have C-V tuning curves where capacitance is proportional to the inverse square root of the bias voltage.

For some varactor applications, a linear C-V tuning curve is preferred, and thus HA junction varactors were developed. HA junction varactors have a doping profile which changes in a controlled non-linear way with density of the dopants increasing towards the junction and abruptly dropping to zero at the junction. With a suitable profile, the varactor's capacitance can be linearly dependant on bias voltage over at least a portion of the varactor's tuning curve.

HA junction varactors may be made with various methods including ion implantation and molecular beam epitaxial growth. As noted above, one of the parameters which affects the capacitance, and C-V tuning curve, of a varactor is the doping profile within the LTE (low temperature epitaxial) layer. Thus, as doping density varies, so does the C-V tuning curve of the varactor. The doping profile may be affected by, among other things, the thickness of the LTE layer. Consequently, the C-V tuning curve of varactors in a particular manufacturing batch may vary significantly from one unit to the next based on variations in the LTE layer thickness. In some examples, the C-V tuning curve has as much as a 50% variation in capacitance in the middle of the curve.

The cause of variations of the LTE layer thickness may be due to variation in initial LTE layer formation as well as changes in the LTE layer thickness caused by subsequent manufacturing steps. Such device variation due to manufacturing variation may be difficult for the design engineer to accommodate and lead to complicated circuit designs and extra steps in circuit fabrication.

Though the C-V tunability of varactors may offer the circuit designer increased freedom in designing certain circuits, known varactors have C-V tuning curves which may vary substantially from one unit to the next. Such variations are due to variations in the fabrication process, such as etching, layer formation, and doping the multiple layers of semiconductor forming the active region (cathode, collector, junction, and anode) of the varactor. In fact, varactor C-V tuning curves may vary by as much 50% from the nominal specification called for by the designer. Accordingly, circuit designs must make more complicated circuits to accommodate C-V tuning curve variation. But, such complicated fabrication processes, and circuit complexity increase the cost of varactor implementation.

Referring to FIG. 1, a related art varactor is shown. The varactor 10 has a Si (silicon) substrate 12 with an N+ subcollector 14 formed therein. The N+ subcollector 14 is positioned in a lower portion of the Si (silicon) substrate 12 and may be formed by ion implanting methods well known to those skilled in the art. For example, arsenic ions can be implanted into the Si substrate 12 to form the subcollector 14 with a dosage of about $1.4 \times 10^{16}$ atoms/cm$^2$ at about 40 KeV energy levels. It should be noted that there are typically diffusion areas adjacent to the N+ subcollector 14, such as, for example, at each end of the N+ subcollector 14 where some of the dopants would diffuse into the surrounding Si substrate 12. The N+ subcollector 14 functions as the cathode of the varactor 10. After forming the N+ subcollector 14 region in the substrate 12, an optional epitaxial Si layer may be formed atop the surface of the substrate 12 utilizing conventional epitaxial growing processes.

Above a portion of the N+ subcollector 14 is a collector 16. The collector 16 is formed by doping the Si substrate 12 with first conductivity type ions of either N-type or P-type. For example, the collector 16 may be formed by implanting with phosphorus ions at about $6 \times 10^{12}$ atoms/cm$^2$ at energy levels of about 700 KeV. Above the N+ subcollector 14 on either side of the collector 16 and next to a reach through implant 20 are isolation regions 18. The isolation regions 18 may be isolation oxides, and may further be shallow trench isolation oxides. In the case where the isolation regions 18 are shallow trench isolation oxides, the isolation regions 18 may be formed, for example, by conventional lithography, etching, and shallow trench fill methods well know to those skilled in the art.

At one end of the Si substrate 12 and between two of the isolation regions 18 is the reach-through implant 20. The reach-through implant 20 extends from a top surface of the varactor 10 into the Si substrate 12 and is in electrical communication with the N+ subcollector 14. The reach-through implant 20 may be formed using conventional methods well known in the art. Accordingly, the same ion dopant utilized to dope other regions of the varactor 10, such as used for doping the N+ subcollector region 14 may be used to form the reach-through implant 20. For example, the reach-through implant 20 may be formed with Sb (antimony) dopant with a $1.4 \times 10^{14}$ atoms/cm$^2$ density at about 200 KeV, or it maybe formed with P (phosphorus) dopant with a $4 \times 10^{15}$ atoms/cm$^2$ density at about 70 KeV.

On top of the reach-through implant 20 is a silicided region 32. The silicided region 32 serves to provide good ohmic contact to underlying reach-through implant 20, and may be formed by methods well known in the art.

On top of the collector 16 is an HA junction 24. The HA junction 24 is formed in the Si substrate 12 above the collector 16 region. The HA junction 24 is formed by doping methods well known in the art. For example, the HA junction 24 may be formed using an N-type dopant, such as Sb at a density of $5 \times 10^{12}$ atoms/cm$^2$ and an energy of about 40 KeV.

On top of each isolation region 18 are sacrificial layers 30. The sacrificial layers 30 serve to protect the underlying Si regions during FET processing. The sacrificial layers 30 are made of, for example, a protect dielectric such as nitride. The sacrificial layers 30 are initially deposited across substantially all of the top surface of the Si substrate 12 and protects the surface during later processing. The dielectric is etched prior to LTE processing and may leave the remaining topography. The sacrificial layers 30 may be formed, for example by PCVD (plasma chemical vapor deposition).

An LTE layer 26 is deposited over the HA junction 24. The LTE layer 26 is made from P-type Si using LTE methods well known to those of ordinary skill in the art. The LTE layer 26 is later doped with P+ type ions by necessary bipolar implants or the standard PFET source/drain ion implant. Accordingly, further bipolar processing steps are required after the HA junction 24 has been formed. Such further bipolar processing may alter the thickness, as well as other parameters, of the HA junction causing variation in the final C-V tuning curve of the varactor.

On top of the LTE region 26 is a silicided layer 34. The silicided layer 34 is formed by 1-step or 2-step silicide processes using conductive metals (i.e.: titanium, cobalt, nickel, etc.) which are well-known in the art. The silicided layer 34 serves to provide good ohmic contact to the LTE layer 26.

As noted above, either bipolar processing during and subsequent to forming the related art HA junction causes unit-to-unit manufacturing variation in related art varactor tuning curves, and such variations in varactors complicates circuit designs. Accordingly, in order to simplify the design of circuits using varactors, a fabrication process which produces varactors having less manufacturing variation in the C-V tuning curve is desirable. Additionally, HA junction varactors which have less unit-to-unit manufacturing variation in the C-V tuning curve are desired.

SUMMARY OF INVENTION

In one aspect of the invention, a varactor having a semiconductor material having a continuous column with a lower region, a middle region, and an upper region is provided. The varactor has a first dopant disposed in the lower region of the continuous column a second dopant disposed in the middle region of the continuous column, and a third dopant disposed in the upper region of the continuous column.

In another aspect, a hyper-abrupt junction varactor having a substrate having a subcollector region and a plurality of isolation regions is provided. The hyper-abrupt junction varactor has a first region of a first conductivity type provided adjacent the subcollector region between at least a pair of the plurality of isolation regions. The varactor has a second region of a second conductivity type which is different from the first conductivity type located adjacent the first region and between the at least pair of isolation regions.

In still another aspect, the invention includes a method of fabricating a varactor. The method includes forming a semiconductor substrate, and doping a lower region of the semiconductor substrate with a first dopant. The method also includes doping a middle region of the semiconductor substrate with a second dopant, and doping an upper region of the semiconductor substrate with a third dopant.

DETAILED DESCRIPTION

The invention relates to hyper-abrupt (HA) junction varactors and to a simplified method of fabrication of HA junction varactors. The invention simplifies varactor fabrication and tightens manufacturing tolerances by eliminating one or more etching or layer formation steps. The varactor formation process avoids etching or layer formation steps by relying mostly on doping steps to form the active region of the varactor. This process and resulting structure is less expensive and easier to produce with tighter manufacturing tolerances.

Also, by using the invention, altering the C-V tuning is easily accomplished by adjusting the doping rates. Thus, C-V tuning curves are shown to be within design parameters using the invention. This invention is compatible with complex fabrication processes or complex circuitry. In fact, the design of the invention uses a semiconductor substrate without little or no etching, or the like, required.

Figure 1:
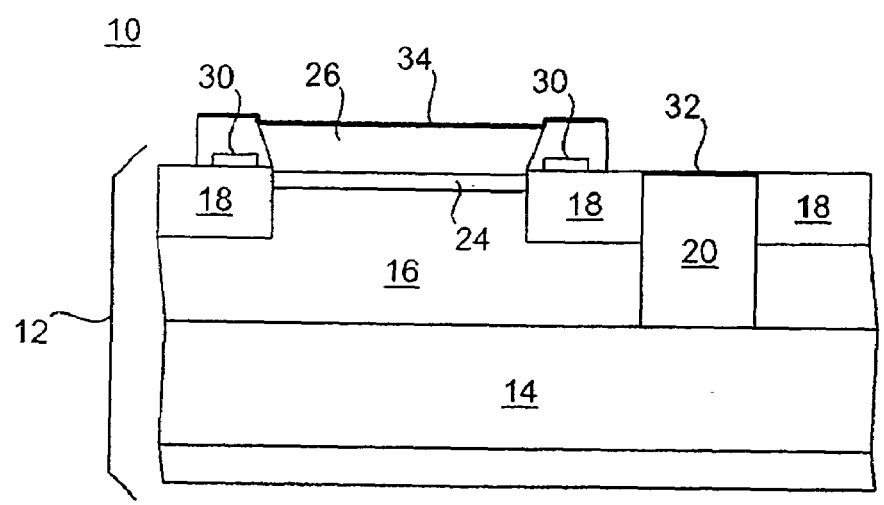
FIG. 1 illustrates a related art HA junction varactor.
Figure 2:
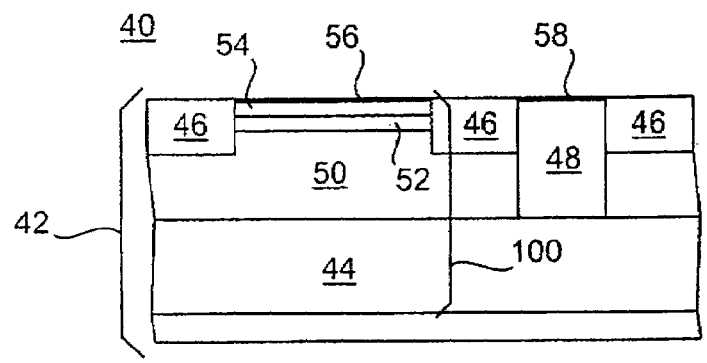
FIG. 2 illustrates a first embodiment of an HA junction varactor in accordance with the invention.

FIG. 2 shows an example of an embodiment in accordance with the invention. In FIG. 2, varactor 40 is shown having a semiconductor material 42. The semiconductor material 42 is doped through several doping processes to form an N+ region 44, an HA junction 52, and an anode region 54. The N+ region 44 may also be referred to as an N+ subcollector or cathode. These regions may be referred to generally as lower, middle and upper regions, respectively. In one implementation of the invention, the N+ region 44 may also include a collector region 50 in its upper portion. The collector region 50 may be formed by the tail of the N+ region 44, and thus may include the same dopant as the N+ region 44 at a lower dopant density or concentration. These components are formed in a continuous column of semiconductor material, generally represented by reference numeral 100.

Referring more specifically to FIG. 2, an embodiment of the HA junction varactor 40 in accordance with the invention is shown which reduces device variation due to manufacturing variations. The HA junction varactor 40 has a Si substrate 42 into which the N+ region 44 is implanted. The N+ region 44 is implanted using a deep ion implant process. For example, the N+ region 44 may be formed using a $10^{14}$ atom/cm$^2$ dose of N-type dopants such as P atoms at about 1 MeV energy levels. Other dopants which may be used include, for example, As (arsenic) and Sb. Accordingly, the N+ region 44 may be formed under a relatively large thickness of Si wafer material, for example about 0.5 µm to 1.5 µm, and positioned at a deep level in the Si substrate 42. As such, there is no need for a buried subcollector process which involves implanting N+ atoms at shallow depth and subsequently growing an epitaxial layer on top of the implanted region. The N+ atoms subsequently diffuse out to form the N+ region 44. Subsequent layers are deposited on top thereof to hold other dopants. Thus, the N+ region 44 may be formed in place within the Si substrate 42, and eliminates the need to form a buried N+ subcollector.

Either before the Si substrate 42 is doped, or after the N+ region 44 is formed, isolation regions 46 are formed in locations which will ultimately be on either side of a collector implant 50 and HA junction 52 and reach through implant 48 formed in subsequent steps. The isolation regions 46 may be shallow trench isolation oxides formed by methods well known to those of skill in the art. For example, the isolation regions 46 may be formed by etching shallow trenches using well know etching techniques, followed by deposition of a trench oxide and CMP (chemical mechanical planarizing).

The N+ region 44 forms the cathode, and the tail of the N+ region doping profile forms the collector 50 of the varactor 40. More specifically, the lower energy atoms of the N+ region 44 doping process penetrate to a shallower depth in the Si substrate 42 than the higher energy atoms. These lower energy atoms are referred to as the "tail" of the N+ region 44 doping profile and form the dopant occupying the region above the N+ region 44, and thus form the collector 50 of the varactor 40. Due to the low energy levels of the low energy atoms, they do not penetrate into the Si substrate 42 as far as the higher energy atoms, and thus form a region above the N+ region 44 of the same dopant atoms as those used to form the N+ region 44.

Accordingly, the collector implant 50 may be formed from N-type dopants, such as, for example, Sb or P atoms. As such, the N+ region 44 and the collector 50 may be formed in one doping step by taking advantage of the energy distribution of the atoms in the first doping process.

The HA junction 52 is formed on top of the collector implant 50 between the two isolation regions 46. The HA junction 52 is formed by a dopant implant into the Si substrate 42 above the collector implant 50. For example, the HA junction 52 may be formed with N-type Sb atoms at about a $10^{13}$ atom/cm$^2$ density at about 200 to 300 KeV energy levels, or As atoms at about a $1\times10^{13}$ atom/cm$^2$ density and at about 100–200 KeV energy levels. It should be noted that all or some of the HA junction 52 doping profile may overlap a portion of the tail of the deeper N+ region 44 dopant profile. Additionally, the HA junction doping profile should be specifically tailored for the later P-type ion implant profile that forms the anode.

A source/drain type implant is used to form the anode 54 above the HA implant 52 between the two isolation regions 46. The anode 54 may be formed with conventional P-type dopants using conventional P+ doping methods well known in the art. The anode 54 may be formed, for example, with B (boron) atoms at about a $1\times10^{15}$ atom/cm$^2$ dosage at about less than 15 KeV energy levels. Other dopants which may be used to form the anode 54 include $BF_2$ (boron fluoride) and In (indium). By utilizing a relatively low energy, the B (boron) atoms are implanted at a shallow depth near the surface of the Si substrate 42. For example, typical implantation depths for the anode 54 range from about 50 Å to about 700 Å.

Accordingly, the active portion of the HA junction varactor is a column of semiconductor material having a lower region with a first dopant, a middle region with a second dopant, and an upper region with a third dopant. The first dopant may be an N-type dopant, and may include P, As, and Sb. The second dopant may be an N-type dopant, and may include P, As, and Sb. The third dopant may be a P-type dopant, and may include B, $BF_2$, In, and Ga (gallium).

Next to one of the isolation regions 46 and above a portion of the N+ region 44, a reach-through implant 48 may be formed. The reach-through implant 48 extends from the top of the varactor 40 into the Si substrate 42 and is in electrical contact or communication with the N+ region 44. The reach-through implant 48 may be formed by conventional methods well known in the art. For example, the reach-through implant 48 may be formed by a two step process by doping with Sb atoms at a dosage of about $1\times10^{14}$ atoms/cm$^2$ at an energy level of about 200 KeV or P atoms at a dosage of about $1\times10^{15}$ atoms/cm$^2$ at an energy level of about 70 KeV.

Still referring to FIG. 2, a first silicided region 55 is formed on the top surface of the Si substrate 42 above the anode 54. A second silicide 58 region is formed on the top of the reach-through implant 48. The silicided regions, 56 and 58, provide ohmic contact to the underlying anode 54 and reach-through implant 48, respectively. The silicided regions, 56 and 58, may be simultaneously formed by either a 1-step or a 2-step silicidation process, using, for example, titanium, cobalt, nickel, or other metals as necessary.

Figure 3:
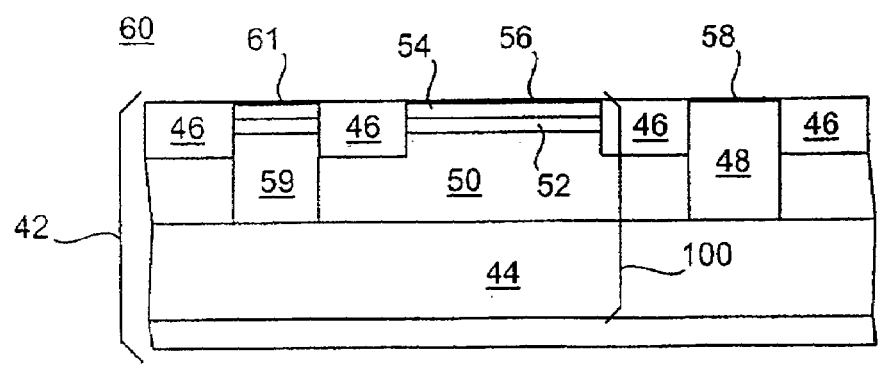
FIG. 3 illustrates a second embodiment of an HA junction varactor in accordance with the invention.

Referring to FIG. 3, an example of a second embodiment 60 in accordance with the invention is shown. In the embodiment shown in FIG. 3, the N+ region 44, collector 50, HA junction 52, and anode 54 are formed by substantially the same process as the embodiment shown in FIG. 2. The embodiment of FIG. 3, though, shows a second reach-through implant 59 to a side of the collector 50, which is in electrical communication with the N+ region 44. The second reach-through implant 59 has a third silicided region 61 formed on a top thereof, and an isolation region 46 on either side. The third silicided region 61 is formed using methods similar to those which may form the first and second silicided regions, 56 and 58.

Consequently, the varactor may be characterized having a substrate having a subcollector region with adjacent multiple isolation regions within the substrate. Also included in the substrate is a first region of a first conductivity type above the subcollector region and between the isolation regions. The varactor also has a second region of a second conductivity type which is a different conductivity type that in the first region. The second region is located above the first region and is also between the isolation regions. Additionally, a third dopant region of the first conductivity type having a dopant concentration lower than a dopant concentration of a first region and a second region is included. The third dopant region is located in the substrate between a first and second dopant regions, and is between the isolation regions. These dopant regions are all formed without the necessity of etching and/or depositing material.

Figure 4:
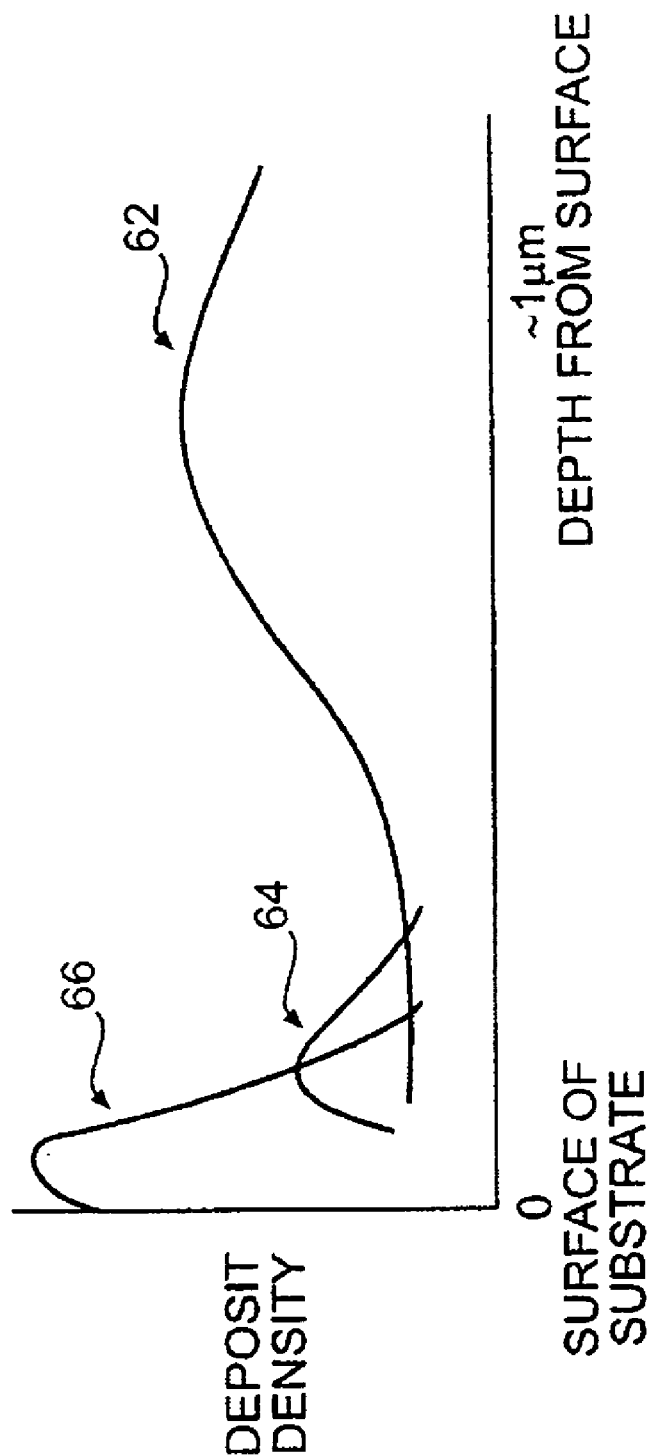
FIG. 4 illustrates a graph of doping profiles of an embodiment of an HA junction varactor in accordance with the invention.

Referring to FIG. 4, an example of dopant profiles in the active portion of the varactor corresponding to the invention are shown. In the graph, the x-axis represents depth below the surface of the Si substrate, with the depth increasing to the right of the axis. The y-axis represents the doping density or concentration, and increases towards the top of the axis. Deeper penetration into the substrate corresponds to higher energy levels for the dopant.

The N+ region profile 62 represents the doping density as a function of depth of the implant resulting from the process which forms the N+ region and the collector of the varactor. For example, the deeper portions of the N+ region profile 62 are formed by the higher energy atoms of the 1 MeV energy, with the lower energy atoms forming the shallower regions of the N+ region profile 62. Thus, the left portion of the N+ region profile 62 represents the collector region of the varactor.

As suggested by the N+ region profile 62 of FIG. 4, the N+ region 44 of FIGS. 2 and 3 may lie on the order of about one µm below the top surface of the continuous column of semiconductor substrate 100. Additionally, the dopant concentrations may range, for example, from about $1 \times 10^{18}$ atoms/cm$^3$ to about $1 \times 10^{20}$ atoms/cm$^3$, depending on the type of dopant used. Also, the dopant dosage densities may form two regions, with a lower region having a higher concentration of dopant than an upper region. In this representation, the upper region of lower dopant concentration represents the collector region 50, while the lower region of higher dopant concentration represents the N+ region 44 of the varactors 40 and 60. The dopant dosage densities may range from approximately $1 \times 10^{17}$ atoms/cm$^3$ to approximately $1 \times 10^{20}$ atoms/cm$^3$.

The HA junction profile 64 represents the doping density as a function of depth of the implant resulting from the process which forms the HA junction 52 of the varactor. As is apparent from the graph, the dopants forming the HA junction 52 are injected into the Si substrate 42 at energy levels lower than the energy levels used to dope the N+ region 44 and collector 50. Additionally, the density of dopant abruptly tapers to zero as the dopant approaches the surface of the Si substrate 42. The depths of the HA junction dopant relative to the N+ region and P+ type dopants are controlled substantially by the relative energy levels of each dopant.

Referring again to FIGS. 2 and 3, the HA junction profile 64 indicates that the dopant forming the HA junction 52 may lie at a shallower depth in the Si substrate 42 than the N+ region 44 and most of the collector 50. The HA junction profile 64 also may occupy a narrower layer of the Si substrate than the N+ region 44. As shown, the HA junction profile 64 may overlap a portion of the N+ region profile 44, and more specifically may overlap a portion of the tail of the N+ region profile 44. The dopant levels may range from approximately $1 \times 10^{17}$ atoms/cm$^3$ to approximately $1 \times 10^{19}$ atoms/cm$^3$.

The anode profile 66 of FIG. 4 represents the doping density as a function of depth of the implant resulting from the anode implanting process. The doping profile of the anode profile 66 has a low doping density near the HA junction profile 64, and quickly increases in concentration towards the surface of the Si substrate. The doping concentration then decreases at the surface of the Si substrate; however, the concentration does not fall below the doping concentrations of the N+ region 62 and HA junction 64 profiles.

Referring again to FIGS. 2 and 3, the anode profile 66 indicates that the dopant forming the anode 54 of the varactors, 40 and 60, mostly lies at a shallower depth than the HA junction 52, collector 50 and N+ region 44. The anode profile 66 also may overlap a portion of the HA junction profile 64 and N+ region profile 62. It should also be noted that the anode profile 66 may extend to or almost to the top surface of the Si substrate 42, and that the anode doping may occupy a layer of Si substrate 42 of about the same thickness as occupied by the HA junction 52. The dopant levels may range from approximately $1 \times 10^{19}$ atoms/cm$^3$ to approximately $1 \times 10^{21}$ atoms/cm$^3$.

As thus described, the active region of the varactor including the cathode, collector, HA junction, and anode is formed by three doping steps. Each of the three doping steps has approximately less energy than the previous doping step in order to deposit its respective dopants at successively shallower depths. Because the active region of the varactor is formed solely by the doping steps, the C-V tuning curve of the resulting varactor is less affected by growing or etching steps, and there is less manufacturing variation from unit to unit. Thus, the resulting varactor is simpler and less expensive to fabricate, and may be manufactured to tighter tolerances.

Additionally, the techniques to form the HA junctions of the above described embodiments may be implemented in a modular form, and thus may be applied in various types of manufacturing technologies including CMOS, rf-CMOS and BiCMOS with little or no variation. Also the HA junction varactor may be manufactured using one additional mask level, although the process is compatible with multiple mask level manufacturing processes.

While the invention has been described in terms of embodiments, those skilled in the art will recognize that the invention can be practiced with modification within the spirit and scope of the appended claims. For example, the invention can be readily applicable to bulk substrates.

The invention claimed is:

1. A varactor, comprising:
   a semiconductor material having a continuous column with a lower region, a middle region, and an upper region, wherein:
   a first dopant is disposed in the lower region of the continuous column;
   a second dopant is disposed in the middle region of the continuous column; and
   a third dopant is disposed in the upper region of the continuous column,
   wherein a majority of the first dopant is disposed in an area centered about 1 µm below the top of the continuous column of semiconductor material.

2. The varactor of claim 1, wherein the lower region defines a cathode, the middle region defines a hyper-abrupt junction, and the upper region defines an anode.

3. The varactor of claim 1, wherein the lower region is comprised of a bottom layer and an upper layer, wherein the bottom layer has a higher concentration of first dopant than the upper layer.

4. The varactor of claim 3, wherein the upper layer defines a collector.

5. The varactor of claim 1, wherein the upper region is substantially planar with an upper surface of the semiconductor material, the upper surface of the semiconductor material including at least one insulation region disposed on a side of the continuous column.

6. The varactor of claim 1, wherein the first dopant comprises a first N-type dopant, the second dopant comprises a second N-type dopant, and the third dopant comprises a P-type dopant.

7. A varactor, comprising:
a semiconductor material having a continuous column with a lower region, a middle region, and an upper region, wherein:
a first dopant is disposed in the lower region of the continuous column; a second dopant is disposed in the middle region of the continuous column; and a third dopant is disposed in the upper region of the continuous column,
wherein the first dopant comprises a first N-type dopant comprising at least one of phosphorus, arsenic, and antimony;
the second dopant is different from the first dopant and comprises a second N-type dopant comprising at least one of phosphorus, arsenic, and antimony; and
the third dopant comprises a P-type dopant comprising at least one of boron, boron fluoride, gallium, and indium.

8. The varactor of claim 1, further comprising at least one isolation region adjacent to the continuous column and above a bottom layer of the lower region of the continuous column.

9. The varactor of claim 1, further comprising at least one reach-through implant in electrical communication with the lower region defined as a cathode region.

10. A hyper-abrupt junction varactor, comprising:
a substrate having a subcollector region and a plurality of isolation regions;
a first region of a first conductivity type is provided above the subcollector region between at least a pair of the plurality of isolation regions;
a second region of a second conductivity type which is different from the first conductivity type being located adjacent the first region and between the at least pair of said plurality of isolation regions;
a third region of the first conductivity type having a dopant concentration lower than a dopant concentration of the first region and the second region, the third region located in the substrate beneath the first and second regions; and
at least one reach-through implant in electrical communication with the subcollector region.

11. The hyper-abrupt junction varactor of claim 10, wherein the second region is located in a layer of the substrate.

12. The hyper-abrupt junction varactor of claim 10, wherein the first region is N-type doped and the second region is P-type doped.

13. A hyper-abrupt junction varactor, comprising:
a substrate having a subcollector region and a plurality of isolation regions;
a first region of a first conductivity type is provided above the subcollector region between at least a pair of the plurality of isolation regions;
a second region of a second conductivity type which is different from the first conductivity type being located adjacent the first region and between the at least pair of said plurality of isolation regions; and
a third region of the first conductivity type having a dopant concentration lower than a dopant concentration of the first region and the second region, the third region located in the substrate beneath the first and second regions,
wherein the first and third regions comprise antimony.

* * * * *